United States Patent
Guering et al.

(10) Patent No.: US 10,130,011 B2
(45) Date of Patent: Nov. 13, 2018

(54) ELECTRONICS CABINET WITH VENTILATION SYSTEM

(71) Applicant: Airbus Operations S.A.S., Toulouse (FR)

(72) Inventors: Bernard Guering, Montrabe (FR); Laurent Saint-Marc, Montaigut sur Save (FR)

(73) Assignee: Airbus Operations S.A.S. (FR)

( * ) Notice: Subject to any disclaimer, the term of this patent is extended or adjusted under 35 U.S.C. 154(b) by 832 days.

(21) Appl. No.: 14/494,660

(22) Filed: Sep. 24, 2014

(65) Prior Publication Data

US 2015/0084491 A1    Mar. 26, 2015

(30) Foreign Application Priority Data

Sep. 25, 2013    (FR) ...................................... 13 59217

(51) Int. Cl.
*H05K 5/00* (2006.01)
*H05K 7/20* (2006.01)

(52) U.S. Cl.
CPC ................................ *H05K 7/20572* (2013.01)

(58) Field of Classification Search
CPC ................................................ H05K 7/20572
USPC ........................................................ 454/184
See application file for complete search history.

(56) References Cited

U.S. PATENT DOCUMENTS

| | | | | |
|---|---|---|---|---|
| 5,851,143 A | * | 12/1998 | Hamid | F24F 11/053 312/223.6 |
| 6,305,180 B1 | * | 10/2001 | Miller | H05K 7/20572 165/104.33 |
| 7,037,188 B2 | * | 5/2006 | Schmid | A47C 21/044 454/187 |
| 7,434,412 B1 | * | 10/2008 | Miyahira | G06F 1/20 165/104.33 |
| 2005/0153649 A1 | * | 7/2005 | Bettridge | H05K 7/20736 454/188 |
| 2010/0073872 A1 | * | 3/2010 | Pakravan | H05K 7/20572 361/695 |
| 2013/0082138 A1 | | 4/2013 | Guering et al. | |

FOREIGN PATENT DOCUMENTS

| | | |
|---|---|---|
| DE | 25 37 295 A1 | 4/1976 |
| FR | 2 831 019 A1 | 4/2003 |
| FR | 2 900 308 A1 | 10/2007 |
| FR | 20110058842 | 4/2013 |
| WO | 2008/014578 A1 | 2/2008 |

OTHER PUBLICATIONS

French Search Report (13 59217) (dated Jun. 3, 2014).

* cited by examiner

*Primary Examiner* — Vivek Shirsat
(74) *Attorney, Agent, or Firm* — Lerner, David, Littenberg, Krumholz & Mentlik, LLP

(57) ABSTRACT

A cabinet designed to accommodate at least one item of electronic equipment and a system for interconnecting such a cabinet with the external networks for blowing and extracting air. The system includes at least one of a blowing inlet and an extracting outlet including a plurality of orifices and at least one hollow structural upright as a part of the blowing circuit or of the extracting circuit.

16 Claims, 4 Drawing Sheets

ELECTRONICS CABINET WITH VENTILATION SYSTEM

FIELD OF THE INVENTION

The present invention relates to a cabinet of the type designed to accommodate at least one item of electronic equipment and to cool it by means of a ventilation system.

BACKGROUND OF THE INVENTION

It is known in this field to have cabinets for items of electronic equipment comprising an internal blowing circuit, designed to transport cold air from a blowing inlet to the items of electronic equipment contained in the cabinet. The cold air is provided by an external blowing network to which the cabinet is connected via the blowing inlet. Similarly, an internal extraction circuit is designed to transport hot air from the items of electronic equipment contained in the cabinet to an extracting outlet. The hot air is passed on to an external extracting network to which the cabinet is connected via the extracting outlet.

It is also known, for example from FR20110058842, to integrate the internal blowing circuit and the internal extracting circuit into the structure of the cabinet.

BRIEF SUMMARY OF THE INVENTION

An aspect of the present invention proposes an alternative cabinet architecture.

An embodiment of the invention relates to a cabinet designed to accommodate at least one item of electronic equipment and to cool it by means of a ventilation system. The cabinet comprises an internal cold air blowing circuit designed to transport cold air from at least one blowing inlet, which can be connected to an external cold air blowing network, to the items of equipment. The cabinet also comprises an internal hot air extracting circuit designed to transport hot air from the items of equipment to at least one extracting outlet which can be connected to an external hot air extracting network. According to one feature, a blowing inlet or an extracting outlet comprises a plurality of orifices.

By virtue of this feature, a plurality of small orifices advantageously replaces a single large opening. These small orifices may thus be separated and may be distant from one another. It is thus possible to distribute and thus to locally reduce the weakening stress which the creation of an inlet or outlet produces in the structure of a cabinet. This reduction makes it possible, more advantageously, to conceive of positioning the inlet or outlet elsewhere.

BRIEF DESCRIPTION OF THE DRAWINGS

Other features, details and advantages of the invention will emerge more clearly from the detailed description given hereinbelow, purely by way of indication, with reference to drawings in which.

In all of these figures, identical references designate identical or similar elements.

DETAILED DESCRIPTION

The invention relates to a cabinet 1, 21 designed to accommodate one or more items of electronic equipment 5, 25. Said items of electronic equipment 5, 25 may selectively be introduced into or extracted from the cabinet 1, 21 and are represented in the extracted position, ready to be introduced. Such a cabinet 1, 21, which may also be termed furniture, cupboard, bay or any other term indicating a structure which can contain elements such as for example at least one item of electronic equipment, provides mechanical support to the items of electronic equipment 5, 25 which it contains, a storage means, protection from the environment, where relevant means for cabling or interconnection, and ventilation in order to expel the heat energy which is most often produced by these items of electronic equipment 5, 25. Such a cabinet 1, 21 thus comprises a structural frame and an external envelope by means of which the volume within can be enclosed. Such a cabinet 1, 21 typically has a substantially parallelepipedal shape.

Figure 1:
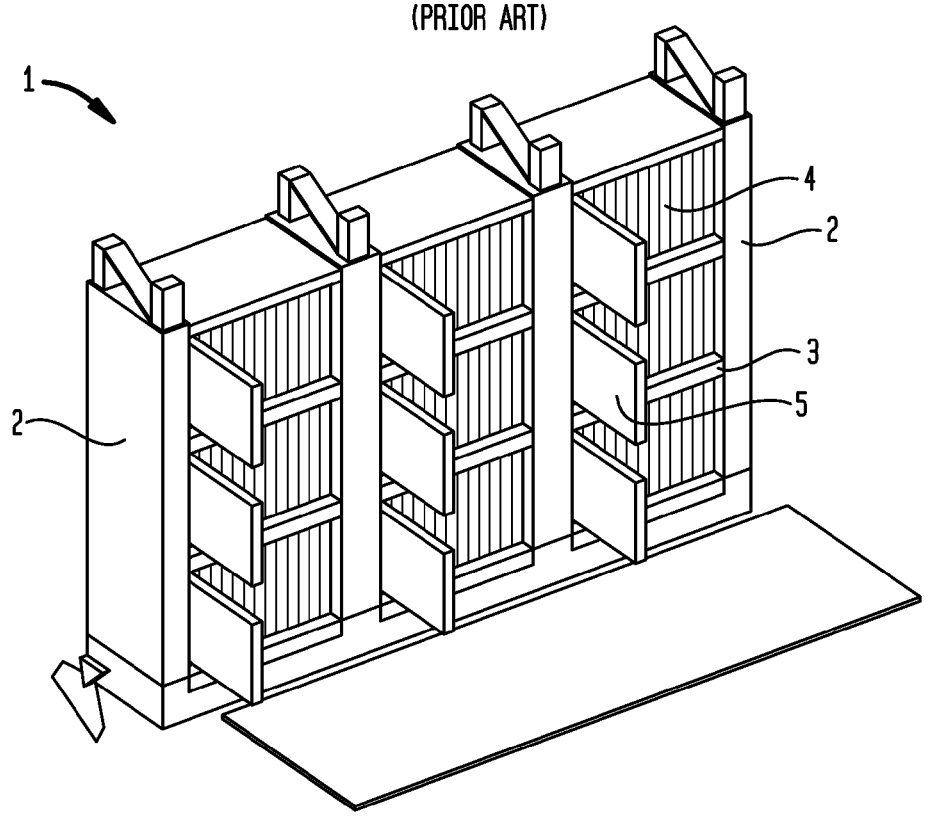
FIG. 1 is a perspective view of a cabinet according to the prior art.

FIG. 1 shows a known possible embodiment of such a cabinet 1. Here, the cabinet 1 comprises four vertical structural uprights 2 separating three columns. Each column comprises four horizontal shelves 3 which delimit three zones. Each of these zones comprises at least one compartment 4 designed to accommodate at least one item of electronic equipment 5.

Figure 2:
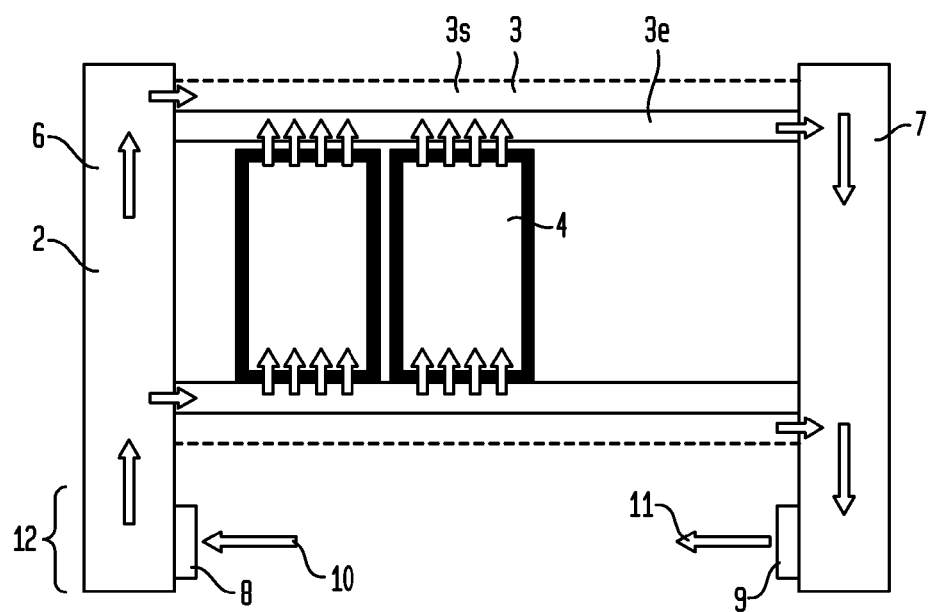
FIG. 2 is a schematic front view illustrating the principle of the ventilation inside a cabinet according to the prior art.

FIG. 2 shows the known ventilation principle of such a cabinet 1. The cabinet 1 integrates a cold air blowing circuit 6 and a hot air extracting circuit 7.

Cold air is air which is sufficiently cold such that, at the forced circulation speed at which it passes through a cabinet 1, it can cool the items of electronic equipment 5. Hot air is the air obtained from the cold air after it has passed through the cabinet 1 and in contact with or close to the items of electronic equipment 5.

The blowing circuit 6, depicted in grey, is designed to transport the cold air. The cold air is provided by a cold air blowing network 10 outside the cabinet 1. The cabinet 1 is interfaced with said blowing network 10 via a blowing inlet 8. The cold air thus received is distributed, by the blowing circuit 6, to the items of electronic equipment 5. On contact with the items of electronic equipment 5 arranged in the compartments 4, the cold air cools the items of equipment 5 and heats up.

The extracting circuit 7, depicted in white, is designed to transport the hot air. The hot air is produced by the cold air passing over the items of electronic equipment 5. The extracting circuit 7 recovers the hot air in the compartments 4 near the items of electronic equipment 5 and extracts it from the cabinet 1, passing it on to a hot air extracting network 11 outside the cabinet 1. The cabinet is interfaced with said extracting network 11 via an extracting outlet 9.

The minimum cross section of either a blowing inlet 8 or an extracting outlet 9 is determined by the flow rate of air which is to circulate through the cabinet 1 in order to cool the items of electronic equipment 5. According to the prior art, a blowing inlet 8, comprising a single orifice, connects the cabinet 1 to the blowing network 10 and an extracting outlet 9, comprising a single orifice, connects the cabinet 1 to the extracting network 11. The cross section of the blowing inlet 8, which is substantially equal to the cross section of the extracting outlet 9, therefore requires a large surface area. The magnitude of this surface area means that it cannot be created just anywhere. The solution most commonly employed in the prior art is to create an extension 12 to the cabinet 1, for example an extension 12 to an upright 2, in order that the inlet 8 and/or outlet 9 may be arranged there. Such an extension 12 thus projects beyond the substantially parallelepipedal volume of the cabinet 1, for example above the upper horizontal plane, or below the horizontal installation plane as shown in FIG. 2. Such a configuration makes it more difficult to integrate the cabinet 1 into its environment.

By contrast, according to an embodiment of the invention, a blowing inlet 28 or an extracting outlet 29 comprises a plurality of orifices 30.

Figure 3:
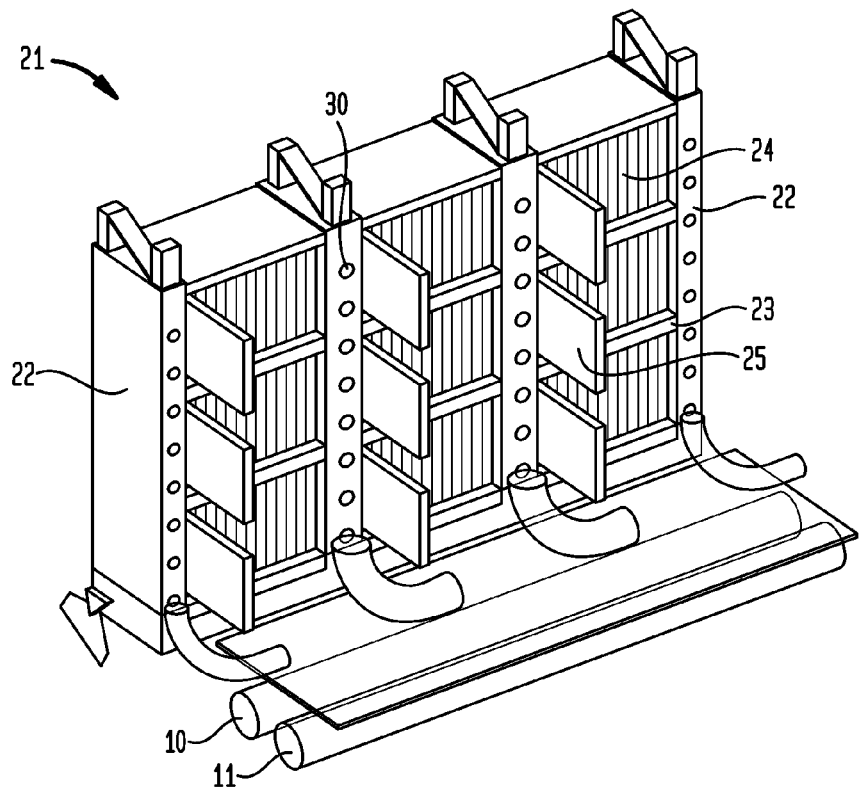
FIG. 3 is a perspective view of a cabinet according to an embodiment of the invention, without a funnel.

FIG. 3 shows a cabinet 21 according to an embodiment of the invention. Here, the cabinet 21 comprises four vertical structural uprights 22 separating three columns. Each column comprises four horizontal shelves 23 which delimit three zones. Each of these zones comprises at least one compartment 24 designed to accommodate at least one item of electronic equipment 25.

Figure 4:
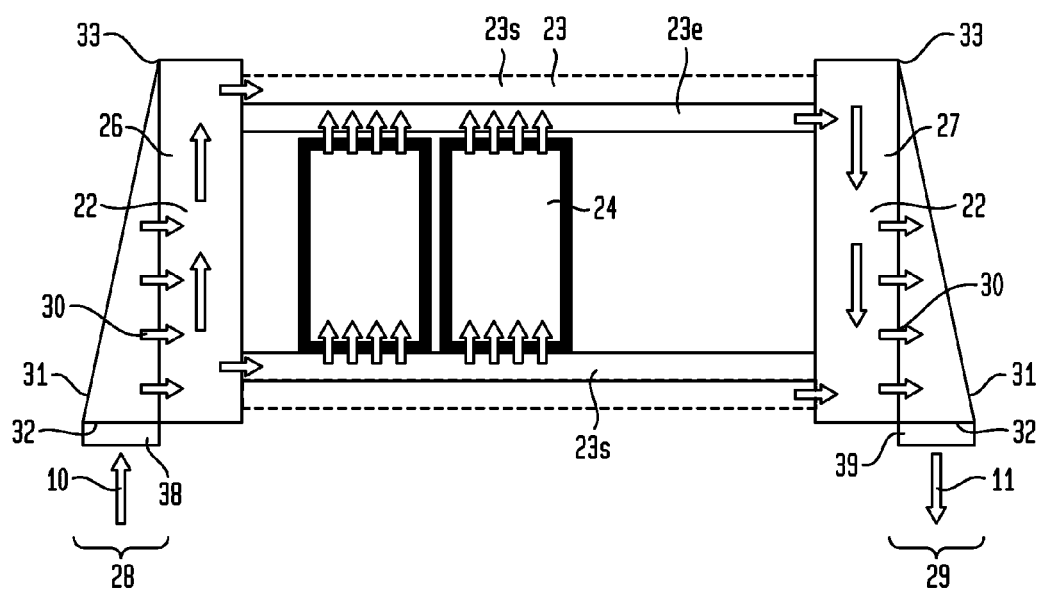
FIG. 4 is a schematic front view illustrating the principle of the ventilation inside a cabinet according to an embodiment of the invention.

FIG. 4 illustrates the ventilation principle of such a cabinet 21. As in the case of the cabinet in FIG. 1, the cabinet 21 integrates a cold air blowing circuit 26 and a hot air extracting circuit 27.

The blowing circuit 26, depicted in grey, is designed to transport the cold air. The cold air is provided by a cold air blowing network 10 outside the cabinet 21. The cabinet 21 is interfaced with said blowing network 10 via a blowing inlet 28. The cold air thus received is distributed, by the blowing circuit 26, to the items of electronic equipment 25. On contact with the items of electronic equipment 25 arranged in the compartments 24, the cold air cools the items of equipment 25 and heats up.

The extracting circuit 27, depicted in white, is designed to transport the hot air. The hot air is produced by the cold air passing over the items of electronic equipment 25. The extracting circuit 27 recovers the hot air in the compartments 24 near the items of electronic equipment 25 and extracts it from the cabinet 21, passing it on to a hot air extracting network 11 outside the cabinet 21. The cabinet 21 is interfaced with said extracting network 11 via an extracting outlet 29.

The minimum cross section of either a blowing inlet or an extracting outlet 29 is, as in the prior art, determined by the flow rate of air which is to circulate through the cabinet 21 in order to cool the items of electronic equipment 25 and is, all else being equal, essentially the same.

In contrast with the prior art in which either a blowing inlet 8 or an extracting outlet 9 comprises a single orifice, according to an embodiment of the invention, either a blowing inlet 28 or an extracting outlet 29 comprises a plurality of orifices 30.

This is advantageous in that, for the same air flow rate through the inlet or outlet 28, 29, and thus a same total surface area pierced in the cabinet 21, this surface area is divided into a plurality of orifices 30 which are much smaller than a single orifice.

The fact that each orifice 30 is much smaller has the advantageous effect that the weakening stress caused by the piercing is substantially reduced. This makes it possible to have new arrangements for said orifice 30 which may now be sited in weaker zones which were excluded hitherto.

The fact that each orifice 30 is much smaller also has the advantageous effect that it may be pierced in smaller zones of the cabinet 21. This makes it possible to have new arrangements for said orifice 30 which may now be sited in smaller zones which were excluded hitherto.

The fact that an inlet or outlet now comprises a plurality of orifices 30 makes it possible to separate and distance these orifices 30 from one another and thus makes it possible to extend an inlet or outlet 28, 29, in order to better distribute the circulation of the air.

The total surface area of all the orifices 30 of an inlet or outlet 28, 29 is at least equal to the surface area determined, all else being equal, for an inlet or outlet created by means of a single orifice. However, by using a plurality of orifices 30 instead of a single orifice makes it advantageously possible to reduce the fragilizing effect of piercing an inlet or outlet in a cabinet 21, and it advantageously becomes possible to increase the total surface area, and thus the air flow rate, by increasing the number of orifices 30.

According to one advantageous embodiment, the structure of the cabinet 1, 21 is created from hollow tubular profiles and these cavities are employed to form, at least in part, the blowing circuit 26 or the extracting circuit 27. Thus, according to the embodiment shown in FIG. 4, at least one upright 22, in this case a vertical upright, thus acts as a trunk of the tree-like blowing circuit 26. A blowing inlet 28 is arranged in this upright 22, on the left in FIG. 4, which thus receives the cold air from the blowing network 10 and then distributes it towards each of the shelves 23. The shelves 23 are also hollow and are thus also part of the blowing circuit 26, distributing the cold air towards the compartments 24 accommodating the items of equipment 25. The shelves 23 have in this case been split into two separate shelves, one shelf 23s which is part of the blowing circuit 26, in this case the lower shelf, and one shelf 23e which is part of the extracting circuit 27, in this case the upper shelf, both with respect to the compartments 24.

After passing through the compartment or compartments 24, in this case from bottom to top, the cold air becomes hot air. It is then transported by a shelf 23e, which is part of the extracting circuit 27. This shelf 23e finishes in another upright 22, on the right in FIG. 4, which is also part of the extracting circuit 27 and is connected via an extracting outlet 29 to the extracting network 11.

The hollow structure of the cabinet 21 is thus advantageously employed in order to create the blowing circuit 26 and the extracting circuit 27. This puts conditions on the location of the blowing inlet 28 and the extracting outlet 29. Since an inlet or outlet 28, 29 interfaces with an external air network 10, 11, it is advantageously located at the periphery of the cabinet 21 and is thus pierced in an upright 22 located at the periphery of the cabinet 21.

As shown in FIG. 2, piercing an inlet or outlet 8, 9 comprising a single orifice implies a large piercing which, on one hand, requires a large surface area of the upright 2 and which, on the other hand, may not be created just anywhere without the risk of weakening said upright 2.

Figure 5:
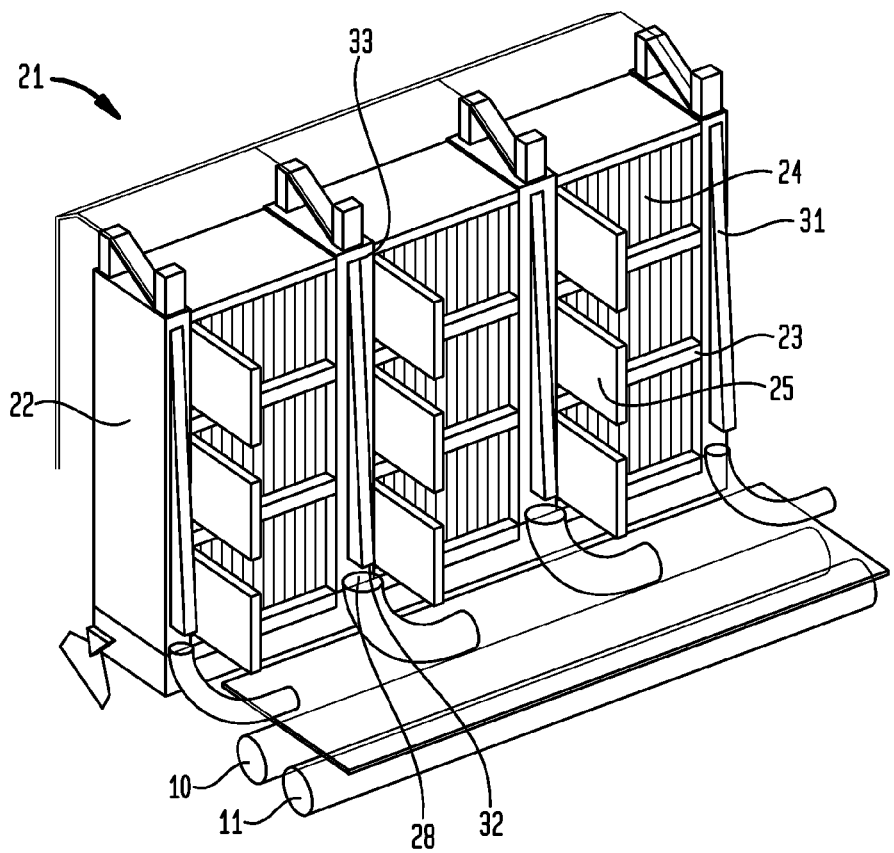
FIG. 5 is a perspective view of the cabinet of FIG. 3, with a funnel.

Thus, in the configuration shown in FIGS. 1, 3, 5, in which the uprights 2, 22 have, in the horizontal direction, a profile which is elongate from front to back, with a large lateral surface area and a small surface area on the front face, an inlet or outlet 8, 9 comprising a single orifice, according to the prior art, may be created only in the large face of the upright 2, that is to say the lateral face. So as to not excessively weaken the upright 2, this inlet or outlet is preferably created in an extension 12 prolonging said upright 2, created for that sole purpose.

In addition, such an arrangement forces the air streams at the blowing inlet 8 or at the extracting outlet 9 to turn through 90°, which disadvantageously creates a turbulent region in said extension 12.

By contrast, according to an embodiment of the invention, creating an inlet or outlet 28, 29 by means of a plurality of orifices 30 makes it possible to greatly relieve these weakening and localizing stresses. An orifice 30, which individually is much smaller, may thus be created in the small face of an upright 22, in this case in the front face. The orifices 30, which are separate, may advantageously be distributed over the entire surface area and all along an upright 22. Small orifices 30 may be created in small areas and may be distributed without excessively weakening the structure of the cabinet 21.

Other locations are thus accessible by virtue of this feature. It is thus possible to arrange orifices 30 and therefore an inlet or outlet 28, 29 in the front face of a cabinet 21. Such an arrangement is particularly advantageous in that it allows easy access to the inlet or outlet 28, 29.

In order to bring together the air streams of a given inlet or outlet 28, 29, which are divided between a plurality of orifices 30, the cabinet 21 comprises a funnel 31 associated with an inlet or outlet 28, 29. This funnel 31 is closed so as to be airtight, save for at least two openings. A first opening forms an end piece 38, 39 designed to be connected to the external blowing network 10 or external extracting network 11, corresponding to the blowing inlet 28 or extracting outlet 29 associated with said funnel 31. At least one second opening surrounds, in an airtight manner, the orifices 30 of said inlet or outlet 28, 29. Thus, a funnel 31 brings together the air streams of the orifices 30 of an inlet or outlet 28, 29 and connects them, in an airtight manner, to the corresponding external network 10, 11.

To that end, a funnel 31 advantageously has an elongate shape, substantially according to the shape of the surface bearing the orifices 30 of an inlet or outlet 28, 29. Its first opening may thus more easily be formed so as to surround said orifices 30. Thus, when the orifices 30 are pierced in an upright 22, the funnel extends the length of the upright 22.

The first opening of the funnel 31 is advantageously formed so as to match the surface comprising the orifices 30 so as to produce an airtight seal around said orifices 30. According to other possible embodiments, the funnel comprises several openings, indeed as many openings as orifices 30, these openings matching, in the same way, the surface comprising the orifices 30 in an airtight manner.

The elongate shape of the funnel 31 comprises two ends 32, 33. One of these ends 32 is advantageously formed as an end piece 38, 39 such that it may be connected to an external network 10, 11.

Figure 6:
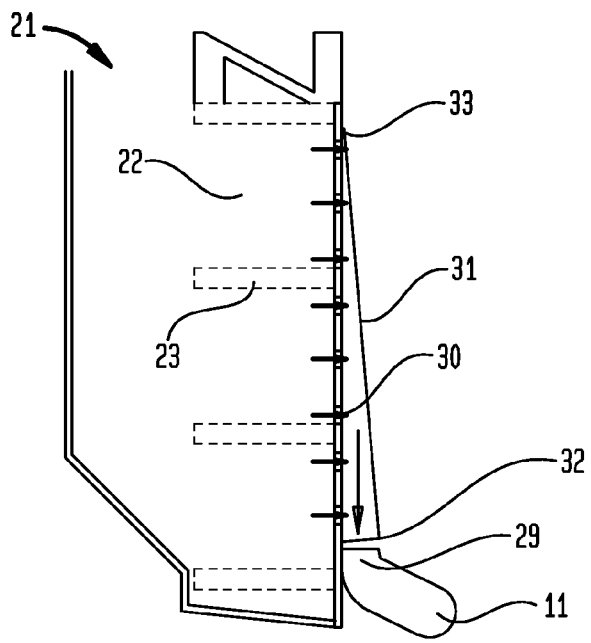
FIG. 6 is a side view of a cabinet according to an embodiment of the invention, showing more particularly the profile of the funnel.

According to another feature, which is shown more particularly in FIG. 6, the funnel 31 advantageously has a cross section which decreases progressively from the end 32 comprising the end piece 38, 39 to the opposite end 33.

The cross section of the funnel 31 is thus, at any given point, adapted to the air flow rate passing through it. Indeed, the cross section of the funnel 31 is small near the distal end 33, where the funnel 31 connects the air stream of a first orifice 30. Then, as one moves towards the proximal end 32, the cross section is progressively increased as the number of orifices 30 covered by the funnel and the number of connected air streams increase. This contributes to a harmonious flow of the air streams, ensuring more efficient ventilation and an advantageous reduction in flow noise.

As shown in FIGS. 5 and 6, a funnel 31 is formed as a shell which completes the surface bearing the orifices 30 so as to close an air flow volume. A funnel 31 may be attached to said surface, and thus to the upright 22 where relevant, for example by means of screws. A seal may be arranged at the interface between the funnel 31 and the surface so as to improve the airtightness. The funnel 31 may be made of any material and by any method. Advantageously, making the funnel of thermoformed plastic or of composite material allows it to be lightweight.

Figure 7:
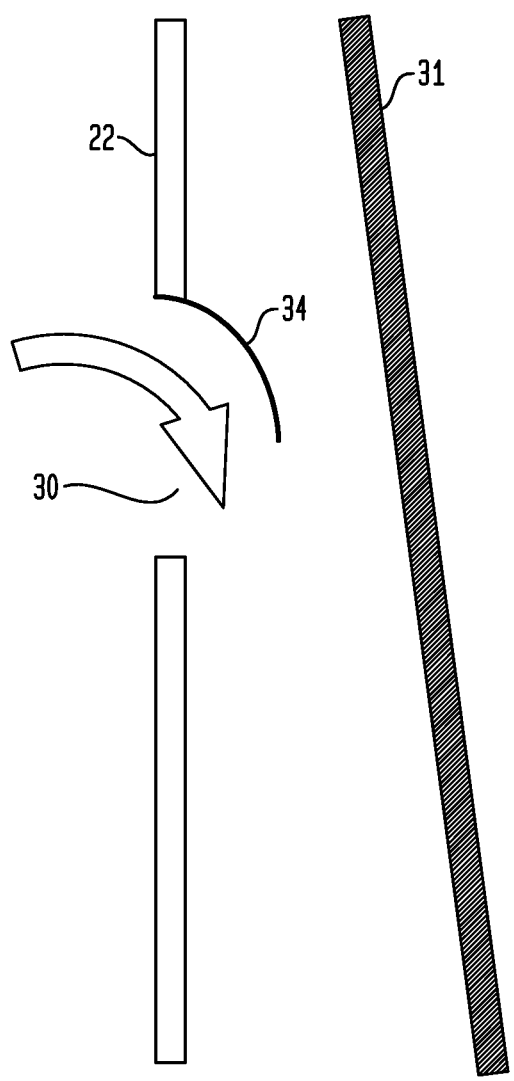
FIG. 7 is a side view showing an orifice according to an embodiment of the invention.

According to another optional feature, more particularly shown in FIG. 7 which shows an orifice 30 seen from the side as in FIG. 6, a bent deflector 34 is added at the at least one orifice 30, and preferably at all the orifices 30. Such a deflector 34 is oriented from the orifice 30 in the direction of the end 32 of the funnel 31 and of the end piece 38, 39 which connects to the external network 10, 11. Thus, an air stream passing through said orifice 30 is advantageously guided, in the manner of turning a corner, substantially a right angle, thus reducing the possible turbulence.

An aspect of the invention thus replaces a blowing inlet, or an extracting outlet, which comprises just a single orifice and which, according to the prior art, amounts to an end piece 8, 9, with a blowing inlet 28, or an extracting outlet 29, comprising a plurality of orifices 30, a funnel 31 advantageously having a progressively variable profile and integrating an end piece 38, 39 for connecting to the external network 10, 11.

Said orifices 30 may be distributed over all or part of the surface of the peripheral uprights 22 of the cabinet 21, preferably on one of the vertical surfaces, and preferably on the front surface. The orifices 30 are advantageously arranged in the uprights 22 arranged in the front face of the cabinet 21. The end piece 38, 39 for connecting to the external network 10, 11 is advantageously located at one end of said upright 22, preferably the bottom end. According to an embodiment of the invention, this advantageously makes it possible to establish the connection to the external networks 10, 11 to the side of and along the length of the cabinet 21 and not above or below the cabinet, as in the prior art.

The invention claimed is:

1. A cabinet configured to accommodate at least one item of electronic equipment and to cool the at least one item by a ventilation system, the cabinet comprising:
    a first hollow structural upright and a second hollow structural upright defining at least one zone configured to accommodate the at least one item of electronic equipment;
    an internal cold air blowing circuit configured to transport cold air from at least one blowing inlet configured to be connected to an external cold air blowing network to said at least one item of equipment, the first hollow structural upright being a part of the internal cold air blowing circuit;
    an internal hot air extracting circuit configured to transport hot air from said at least one item of equipment to at least one extracting outlet configured to be connected to an external hot air extracting network, the second hollow structural upright being a part of the internal hot air extracting circuit;
    a blowing inlet of the internal cold air blowing circuit comprising a first plurality of orifices distributed in the first hollow structural upright for introducing the cold air into the first hollow structural upright; and
    an extracting outlet of the internal hot air extracting circuit comprising a second plurality of orifices distributed in the second hollow structural upright for expelling the hot air out of the second hollow structural upright.

2. The cabinet according to claim 1, wherein the first and second hollow structural uprights are tubular and positioned at the periphery of the cabinet.

3. The cabinet according to claim 1, wherein the surfaces in which the first plurality and the second plurality of orifices are created are in a front face of the cabinet.

4. The cabinet according to claim 1, further comprising a funnel closed save for at least two openings, a first opening forming an end piece and configured to be connected to the blowing network or to the extracting network, and at least one second opening surrounding, in an airtight manner, the corresponding first plurality or second plurality of orifices of a corresponding blowing inlet or extracting outlet.

5. The cabinet according to claim 4, wherein the funnel has an elongate shape according to the shape of the surface comprising the first plurality or the second plurality of orifices, and in which the end piece is positioned at one end of the funnel.

6. The cabinet according to claim 4, wherein the funnel has a cross section which decreases progressively from the end comprising the end piece to the opposite end.

7. A cabinet configured to accommodate at least one item of electronic equipment and to cool the at least one item by a ventilation system, the cabinet comprising:
  a first hollow structural upright and a second hollow structural upright defining at least one zone configured to accommodate the at least one item of electronic equipment;
  an internal cold air blowing circuit configured to transport cold air from at least one blowing inlet configured to be connected to an external cold air blowing network to said at least one item of equipment, the first hollow structural upright being a part of the internal cold air blowing circuit;
  an internal hot air extracting circuit configured to transport hot air from said at least one item of equipment to at least one extracting outlet configured to be connected to an external hot air extracting network, the second hollow structural upright being a part of the internal hot air extracting circuit;
  a blowing inlet of the internal cold air blowing circuit comprising a first plurality of orifices distributed in the first hollow structural upright for introducing the cold air into the first hollow structural upright;
  an extracting outlet of the internal hot air extracting circuit comprising a second plurality of orifices distributed in the second hollow structural upright for expelling the hot air out of the second hollow structural upright; and
  a funnel closed save for at least two openings, a first opening forming an end piece and configured to be connected to the blowing network or to the extracting network, and at least one second opening surrounding, in an airtight manner, the corresponding first plurality or second plurality of orifices of a corresponding blowing inlet or extracting outlet,
  wherein at least one orifice of the first plurality and the second plurality of orifices comprises a deflector bent towards the end piece.

8. A cabinet configured to accommodate at least one item of electronic equipment and to cool the at least one item by a ventilation system, the cabinet comprising:
  a first hollow structural upright and a second hollow structural upright defining at least one zone configured to accommodate the at least one item of electronic equipment;
  an internal cold air blowing circuit configured to transport cold air from at least one blowing inlet configured to be connected to an external cold air blowing network to said at least one item of equipment, the first hollow structural upright being a part of the internal cold air blowing circuit;
  an internal hot air extracting circuit configured to transport hot air from said at least one item of equipment to at least one extracting outlet configured to be connected to an external hot air extracting network, the second hollow structural upright being a part of the internal hot air extracting circuit;
  a blowing inlet of the internal cold air blowing circuit comprising a first plurality of orifices distributed in the first hollow structural upright;
  an extracting outlet of the internal hot air extracting circuit comprising a second plurality of orifices distributed in the second hollow structural upright; and
  a funnel closed save for at least two openings, a first opening forming an end piece and configured to be connected to the blowing network or to the extracting network, and at least one second opening surrounding, in an airtight manner, the corresponding first plurality or second plurality of orifices of a corresponding blowing inlet or extracting outlet,
  wherein the surfaces in which the orifices are created are in a front face of the cabinet, the front face being transverse to a direction of insertion of at least one item of equipment into the cabinet.

9. The cabinet according to claim 8, wherein the first and second hollow structural uprights are tubular and positioned at the periphery of the cabinet.

10. The cabinet according to claim 8, wherein the funnel has an elongate shape according to the shape of the surface comprising the first plurality or the second plurality of orifices, and in which the end piece is positioned at one end of the funnel.

11. The cabinet according to claim 8, wherein the funnel has a cross section which decreases progressively from the end comprising the end piece to the opposite end.

12. The cabinet of claim 1, wherein the first hollow structural upright and the second hollow structural upright are spaced apart from one another.

13. The cabinet of claim 8, wherein the first and second hollow structural uprights are tubular and positioned at the periphery of the cabinet.

14. The cabinet of claim 8, wherein the surfaces in which the first plurality and the second plurality of orifices are created are in a front face of the cabinet.

15. The cabinet of claim 8, wherein the funnel has an elongate shape according to the shape of the surface comprising the first plurality or the second plurality of orifices, and in which the end piece is positioned at one end of the funnel.

16. The cabinet of claim 15, wherein the funnel has a cross section which decreases progressively from the end comprising the end piece to the opposite end.

* * * * *